US008421997B2

(12) United States Patent
Michaloski

(10) Patent No.: US 8,421,997 B2
(45) Date of Patent: Apr. 16, 2013

(54) ACTIVE SPOT ARRAY LITHOGRAPHIC PROJECTOR SYSTEM WITH REGULATED SPOTS

(75) Inventor: Paul Francis Michaloski, Rochester, NY (US)

(73) Assignee: Corning Incorporated, Corning, NY (US)

( * ) Notice: Subject to any disclaimer, the term of this patent is extended or adjusted under 35 U.S.C. 154(b) by 903 days.

(21) Appl. No.: 12/511,372

(22) Filed: Jul. 29, 2009

(65) Prior Publication Data

US 2010/0026979 A1 Feb. 4, 2010

Related U.S. Application Data

(60) Provisional application No. 61/085,387, filed on Jul. 31, 2008.

(51) Int. Cl.
*G03B 27/72* (2006.01)
(52) U.S. Cl.
USPC .............................................. 355/71; 355/67
(58) Field of Classification Search .................... 355/53, 355/67, 71; 359/224, 291, 642, 663, 855; 430/5, 30, 296, 311; 347/241
See application file for complete search history.

(56) References Cited

U.S. PATENT DOCUMENTS

| 6,379,867 | B1 | 4/2002 | Mei |
| 2004/0100680 | A1* | 5/2004 | Huibers et al. ................ 359/291 |
| 2005/0024477 | A1 | 2/2005 | Noguchi et al. |
| 2005/0200820 | A1 | 9/2005 | Gui |
| 2006/0012767 | A1* | 1/2006 | Komatsuda et al. ............ 355/67 |
| 2006/0132751 | A1 | 6/2006 | Baselmans et al. |
| 2006/0245032 | A1* | 11/2006 | Doan et al. ..................... 359/291 |
| 2007/0171508 | A1* | 7/2007 | Huibers ......................... 359/291 |

FOREIGN PATENT DOCUMENTS

EP 1480086 A1 11/2004

OTHER PUBLICATIONS

Ren Yang et al. in "Design and fabrication of microlens and spatial filter array by self-alignment for maskless lithography systems," SPIE, J. Microlith., Microfab., Microsyst., vol. 2 No. 3, 210-219, Jul. 2003.
U.S. Appl. No. 61/130,363 on May 30, 2008 entitled "Illumination System for Sizing Focused Spots of a Patterning System for Maskless Lithography" by Joshua M. Cobb.

* cited by examiner

*Primary Examiner* — Hoon Song
*Assistant Examiner* — Mona M Sanei
(74) *Attorney, Agent, or Firm* — Timothy M. Schaeberle

(57) ABSTRACT

An active spot array projection system particularly for microlithographic projection includes a spatial light modulator, such as a digital micromirror device, having individually addressable elements. A focusing array, such as a microlens array, focuses elements transverse segments of the light beam into spots. Within an imaging optic between the spatial light modulator and the focusing array, an spatial frequency filter attenuates certain spatial frequencies of light arising from the irregularities of the individually addressable elements while avoiding attenuating higher spatial frequencies of light arising from the peripheral boundaries of the individually addressable elements for regulating light distributions of the spots while limiting crosstalk between adjacent spots.

21 Claims, 6 Drawing Sheets

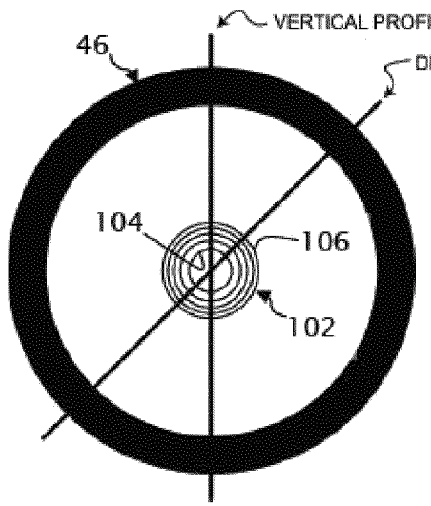
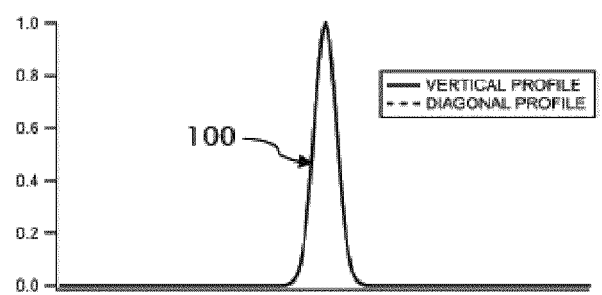
FIG. 4A
FIG. 4B
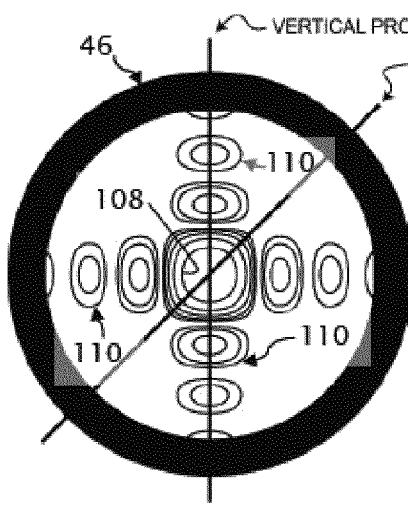
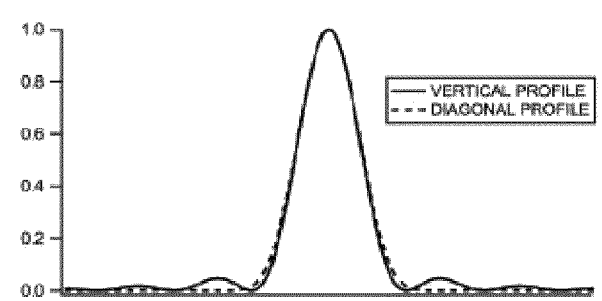
FIG. 5A
FIG. 5B

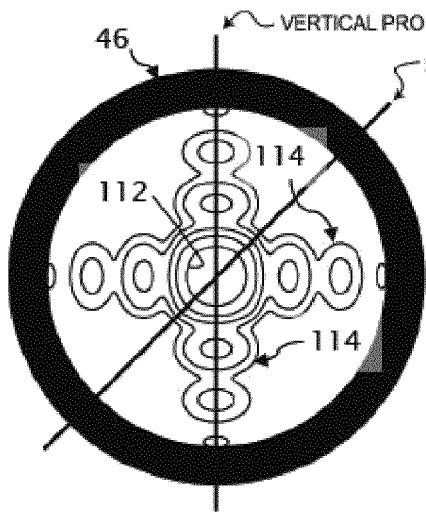
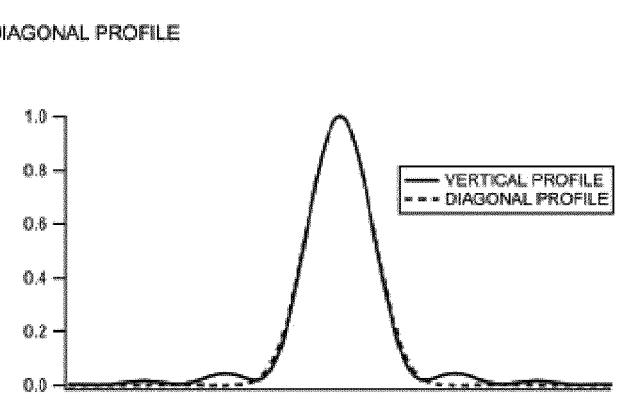
FIG. 6A
FIG. 6B
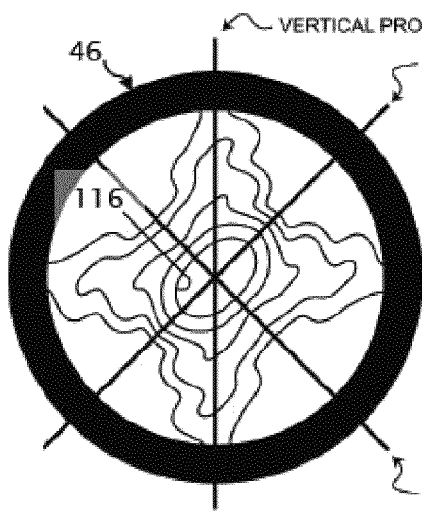
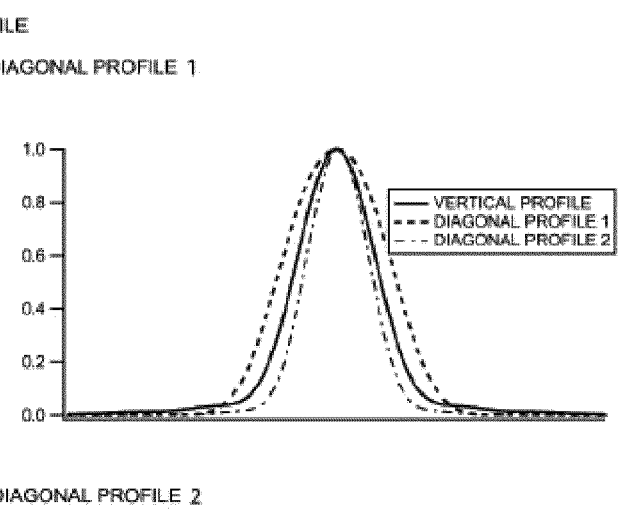
FIG. 7A
FIG. 7B

ACTIVE SPOT ARRAY LITHOGRAPHIC PROJECTOR SYSTEM WITH REGULATED SPOTS

CROSS-REFERENCE TO RELATED APPLICATIONS

This application claims the benefit of priority under 35 U.S.C. §119(e) of U.S. Provisional Application Ser. No. 61/085,387 filed on Jul. 31, 2008.

TECHNICAL FIELD

Microlithographic projection systems with addressable light modulating arrays project actively controlled patterns of spots onto photosensitive substrates. Such systems are particularly useful for manufacturing flat panel displays, printed circuit boards, micromechanical systems, and other microelectronic devices.

BACKGROUND OF THE INVENTION

Conventional microlithographic systems project images of masks (also referred to as reticles) onto photosensitive substrates. For projecting modified or even larger patterns, the masks must be replaced with other masks containing the different or extended patterns.

So-called "maskless" or "reticle-free" microlithographic systems replace the masks with spatial light modulating arrays and projection systems for generating controllable patterns onto substrates. The spatial light modulating arrays regulate transmissions of individual transverse segments of light through the microlithographic systems for projecting patterns of spots onto photosensitive substrates. Each spot is regulated by one or more addressable elements of the light modulating arrays. Under programmed control, the patterns of spots vary with a relative translation of the photosensitive substrates to expose a continuously adjustable pattern of spots on the substrates.

The addressable elements of the spatial light modulating arrays function as micromechanical switches for controlling whether or not the individual transverse segments of the light reach the photosensitive substrates. Different optical mechanisms can be used for the switching function such as phase shifting as provided by grating light valve devices or directionally controlled reflections as provided by digital micromirror devices.

Typically, the projection systems form a magnified image of each of the individually addressable elements on corresponding microlenses of a microlens array, and the individual microlenses of the microlens array concentrate the light from the individual addressable elements through focused spots. Together, the magnification and focusing functions result in the focused spots being spaced apart. The pattern of focused spots includes multiple rows of focused spots and is oriented at a slight angle to a direction of translation with respect to the substrate so that successive rows of the focused spots provide for selectively illuminating the entire scanned area of substrate.

Highly resolved spots are needed for patterning closely spaced features on the substrates in sharp relief. Increased resolution is achieved by the multistage projection system in which the light segments emerging from the addressable elements are directed through respective foci, and the foci are relayed to form the regulated spots on the substrate. However, imperfections within the addressable elements can distort the size and shape of the spots, and thereby lessen resolution of the resulting projected image.

For example, the micromechanical mirrors of digital micromirror devices can include surface irregularities that depart from idealized flat specular surfaces of the micromirrors. The departures in slope increase the range of angular reflections of light from the micromirrors resulting in a corresponding increase one or more dimensions of the focused spots. While it may be possible to stop down an aperture of an imaging lens within the projection system for removing the increased range of angular reflections of light from the micromirrors, the reduced aperture size also limits the capability of the projection system to distinguish between light segments emerging from adjacent micromirrors. Such so-called "crosstalk" between adjacent micromechanical mirrors reduces contrast of the projected patterns by overlapping images of the micromirrors on the microlens array. Instead of each microlens receiving light from just its associated micromirror, inadequately imaged light from individual micromirrors can spread into adjacent microlenses and partially illuminate focused spots not intended for generating the desired image.

SUMMARY OF THE INVENTION

The invention, as envisioned for one or more embodiments, accommodates imperfections within the addressable elements of spatial light modulators while generating highly resolved patterns on photosensitive substrates. The patterns can be generated by a controllable array of focused spots that are relatively translatable across the photosensitive substrates. Control can be exerted over the shape of the spots to compensate for shape distortions otherwise produced by the imperfections in the addressable elements. Accommodations can also be made for influencing desired energy distributions with the focused spots.

One expression of the invention as an active spot array projection system includes a spatial light modulator having individually addressable elements for selectively conveying corresponding transverse segments of a light beam along an optical pathway. The individually addressable elements have peripheral boundaries as well as certain irregularities within the peripheral boundaries, which can be common among the addressable elements. A focusing array along the optical pathway includes individual focusing elements for focusing the transverse segments of the light beam into spots. An imaging optic along the optical pathway images the individually addressable elements of the spatial light modulator onto the individual focusing elements. A spatial frequency filter along the optical pathway at least partially attenuates certain spatial frequencies of light within the transverse segments arising from the irregularities of the individually addressable elements while avoiding attenuation of higher spatial frequencies of light within the transverse segments arising from the peripheral boundaries of the individually addressable elements for regulating light distributions of the spots while limiting crosstalk between adjacent spots. The attenuation of the certain spatial frequencies alters angular distributions of light incident upon the focusing array without significantly degrading the resolution of the images of the individually addressable elements of the spatial light modulator that are imaged onto the individual focusing elements of the focusing array.

An illuminator preferably provides for illuminating the individually addressable elements of the spatial light modulator with the light beam. The preferred illuminator has an exit pupil sized for filling a limited portion of an entrance pupil of the imaging optic such that encounters of the light beam with regular features of the individually addressable elements of the spatial light modular remain substantially within the limited portion of the imaging optic pupil filled by the illuminator pupil. Encounters of the light beam with the irregularities of the individually addressable elements of the spatial light modular expand beyond the limited portion of the imaging optic pupil filled by the illuminator pupil.

The spatial frequency filter preferably attenuates light within an intermediate radial zone of the imaging optic pupil. The intermediate radial zone (a) extends radially beyond the limited portion of the imaging optic pupil filled by the illuminator pupil for attenuating light arising from the irregularities of the individually addressable elements, and (b) is radially offset from a periphery of the imaging optic pupil so that at least a portion of the light within the transverse segments arising from the peripheral boundaries of the individually addressable elements passes through the imaging optic pupil.

In addition to limiting the attenuation of light to an intermediate radial zone, the spatial frequency filter can further limit the attenuation of light to within angularly spaced parts of the intermediate radial zone to restore radial symmetry among a distribution of angles that converge to form the spot. The spatial frequency filter can take the form of an apodizer or phase plate located proximate to an aperture stop of the imaging optic. However, the spatial frequency filter can also take the form of an interference filter located proximate to a field stop of the imaging optic.

The spatial light modulator can be a digital micro-mirror device and the individually addressable elements can comprise mirrors that are independently switchable between one position that conveys the corresponding transverse segments of a light beam along the optical pathway and another position that conveys the corresponding transverse segments of the light beam in another direction. The irregularities of the individually addressable elements correspond to local slope variations within the mirrors that depart from flatness including at least portions of divots associated with connections between the mirrors and their switching devices. The peripheral boundaries of the individually addressable elements correspond to edges of the mirrors.

Another expression of the invention as an active spot array projection system includes a digital micromirror device having individually addressable mirrors for selectively reflecting transverse segments of a light beam along an optical pathway. The individually addressable mirrors have peripheral edges and surface irregularities that depart from flatness through variations in slope. An illuminator illuminates the individually addressable mirrors of the digital micromirror device with the light beam. A microlens array along the optical pathway includes individual microlenses for focusing the transverse segments of the light beam into spots. An imaging lens along the optical pathway images the individually addressable mirrors of the digital micromirror device onto the individual microlenses of the microlens array. The illuminator has an exit pupil sized for filling a limited portion of an entrance pupil of the imaging lens. The peripheral edges and surface irregularities of the mirrors depart from flatness so as to at least partially fill a remaining portion of the imaging lens pupil. A filter attenuates some of the light within the remaining portion of the imaging lens pupil for regulating a shape of the spots while retaining other of the light within the remaining portion of the imaging lens pupil for imaging the peripheral edges of the mirrors onto the microlens array.

Portions of the individually addressable mirrors that do not depart from flatness reflect light through angles that remain substantially within the limited portion of the imaging lens pupil filled by the illuminator pupil. However, other portions of the individually addressable mirrors that depart from flatness, including both the peripheral edges and surface irregularities of the mirrors, reflect different angles of light that expand beyond the limited portion of the imaging lens pupil filled by the illuminator pupil into the remaining portion of the imaging lens pupil.

The filter is preferably a spatial frequency filter that attenuates certain spatial frequencies of light that expand into the remaining portion of the imaging lens pupil. A low range of the spatial frequencies of light is located within the limited portion of the imaging lens pupil filled by the illuminator pupil and both a midrange and high range of the spatial frequencies of light are located within the remaining portion of the imaging lens pupil. The spatial frequency filter can attenuate certain of the midrange of the spatial frequencies for regulating the shape of the spots without attenuating the higher spatial frequencies that contribute to imaging the peripheral edges of the mirrors.

Yet another expression of the invention involves a method of shaping focal spots within an active spot array projection system. A spatial light modulator having individually addressable elements is illuminated for selectively conveying corresponding transverse segments of a light beam along an optical pathway to a focusing array. The transverse segments of the light beam reaching individual focusing elements of the focusing array are focused into spots. Certain spatial frequencies of light within the transverse segments arising from irregularities of the individually addressable elements are attenuated while certain higher spatial frequencies of light within the transverse segments arising from peripheral boundaries of the individually addressable elements are not similarly attenuated so as to regulate light distributions of the spots while limiting crosstalk between adjacent spots.

Preferably, the individually addressable elements of the spatial light modulator are imaged onto the individual focusing elements of the focusing array. The individually addressable elements of the spatial light modulator are preferably illuminated through a first numerical aperture and the individually addressable elements of the spatial light modulator are preferably imaged onto the individual focusing elements through a second numerical aperture that is larger than the first numerical aperture. Light between the first and second numerical apertures is preferably subject to the attenuation.

An illuminator can be arranged for filling a limited portion of an entrance pupil of an imaging optic for imaging the individually addressable elements of the spatial light modulator onto the individual focusing elements of the focusing array. Light attenuated within the entrance pupil of the imaging optic is preferably outside the limited portion filled by the illuminator and offset from a periphery of the entrance pupil.

BRIEF DESCRIPTION OF THE DRAWING FIGURES

FIG. 4A is a plan view of an imager aperture stop within the projection system containing contours showing a distribution of light from an ideal micromirror discounting diffractive effects.

FIG. 4B is a graph containing matching vertical and diagonal intensity profile plots across the aperture stop of FIG. 4A.

FIG. 5A is a plan view of the imager aperture stop containing contours showing a distribution of light arising from the diffractive effects of the mirror edges.

FIG. 5B is a graph comparing vertical and diagonal intensity profile plots across the aperture stop of FIG. 5A.

FIG. 6A is a plan view of the imager aperture stop with intensity contours depicting combined distributions of light from the reflective surface and edges of an ideal micromirror.

FIG. 6B is a graph comparing vertical and diagonal intensity profile plots across the aperture stop of FIG. 6A.

FIG. 7A is a plan view of the imager aperture stop with intensity contours depicting a distribution of light from the irregularly shaped reflective surface and edges of a micromirror such as shown in FIG. 2.

FIG. 7B is a graph comparing a vertical and two diagonal intensity profile plots across the aperture stop of FIG. 7A.

DETAILED DESCRIPTION OF THE INVENTION

Figure 1:
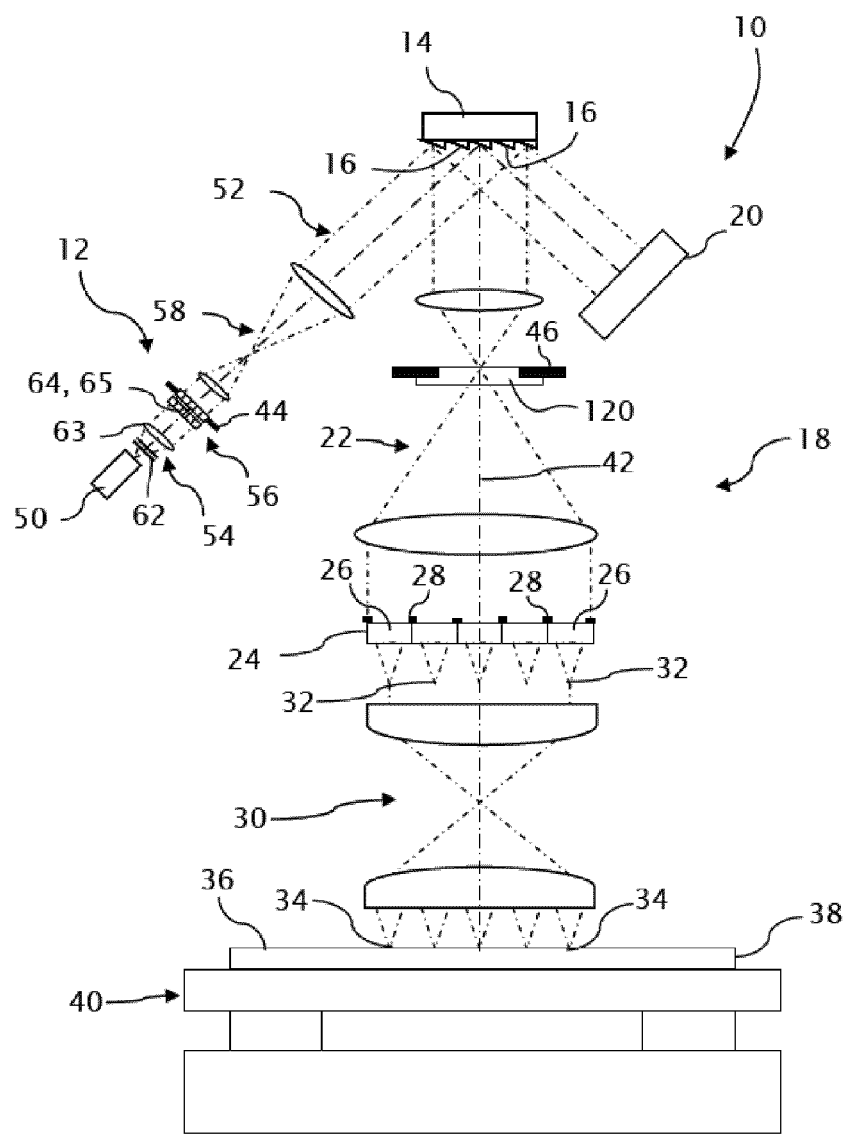
FIG. 1 is a diagram of a microlithographic projection system in the form of an active spot array projection system in accordance with the invention for projecting well-formed spots onto a substrate.

A microlithographic projection system 10, as an example of an active spot array projection system, is adapted in accordance with the invention for projecting patterns of well-formed spots. A pattern generator 14, including individually addressable elements 16, receives homogenized light from an illuminator 12 for directing discrete portions of the light to either a projector 18 or a beam dump 20, depending on the addressable states of the elements 16.

An imager 22 of the projector 18 images the addressable elements 16 of the pattern generator 14 onto corresponding microlenses 26 of a microlens array 24. A sufficient numerical aperture (e.g., 0.08 or higher) is chosen for the imager 22 to accurately reproduce magnified images of the addressable elements 16 on the microlenses 26 without significant crosstalk or overlap onto adjacent microlenses 26. Field stops 28 surround the entrance apertures of the microlenses 26 to block light from edges of the addressable elements 16. A relay lens 30 images focal points 32 of the microlenses 26 as a pattern of focused spots 34 on a surface 36 of light-sensitive substrate 38. A stage 40 relatively translates the light-sensitive substrate 38 along one or more orthogonal axes with respect to the pattern of focused spots 34. Although not shown, the projector 18 is preferably translatable with respect to the stage 40 along an optical axis 42 of the projector 18 for adjusting the focused spots 34 to their intended positions on the substrate surface 36.

The pattern generator 14, which is preferably a type of spatial light modulator, can take a variety of forms for modulating transmissions or reflections based on a number of different mechanisms including phase-shifting, diffraction, polarization modulation, shuttering, or directional reflection. Depicted as a programmable mirror array, the pattern generator 14 is preferably a digital micromirror device of a type sold by Texas Instruments Incorporated as DLP® technology.

The illuminator 12 includes an extended light source 50, which emits an expanding beam 52, a profiler 54 for further expanding the beam 52, a uniformizer 56 for integrating light within the beam 52, and a relay 58 that conveys the integrated light of the beam 52 to the pattern generator 14. The extended light source 50 preferably includes a cluster of light emitters arranged in an array having an aspect ratio matching the aspect ratio of the pattern generator 14. For example, a plurality of laser diodes (not shown) can be coupled to a set of multimode optical fibers (not shown) with light emitting ends that are bundled into the desired array. Alternatively, single light sources or other combinations of light sources can be used to inject light into the illuminator 12. The profiler 54 preferably includes a collecting lens 63 for coupling light into the uniformizer 56 over an area of the illuminator aperture stop 44. The uniformizer 56 is preferably an imaging type homogenizer assembled from two fly's eye arrays 64 and 65. Additional details of a preferred illuminator for a microlithography system are disclosed in co-assigned U.S. Patent Application 61/130,363 on May 30, 2008 entitled Illumination System for Sizing Focused Spots of a Patterning System for Maskless Lithography, which is hereby incorporated by reference.

The illuminator 12 has a numerical aperture at the pattern generator 14 that is less than the numerical aperture of the imager 22 at the pattern generator 14. The illuminator aperture stop 44 is conjugate to (a) an aperture stop 46 of the imager 22, (b) the focal points 32 of the microlens array 24, and (c) the focused spots 34 on the substrate surface 36. As such, the illuminator aperture stop 44 is imaged within the imager aperture stop 46 at a size less than a size of the imager aperture stop 46. The illuminator 12 underfills the aperture stop 46 of the imager 22 in a ratio of apertures (illumination aperture diameter to imager aperture diameter) referred to as coherence parameter σ, which is inversely related to spatial coherence. Since the focused spots 34 are conjugate to the imager aperture stop 46 and the imager aperture stop 46 is underfilled as a consequence of the coherence parameter σ being less than unity, the size of the focused spots 34 (e.g., focal diameter) is also reduced while the focal depth is increased.

Although the illuminator 12 is designed to underfill the imager aperture stop 46, light enters a remainder of the imager aperture stop 46 as a consequence of irregularities and peripheral boundaries of the addressable elements 16 of the pattern generator 14. For example, the micromirrors of a digital micromirror device include reflective surfaces that contain departures from flatness and boundaries in the form of edges, such that the light collected by the imager 22 has a reduced spatial coherence. The departures from flatness reflect light through include higher angles of reflection, and light diffracts from the edges through a larger range of angles. Light entering the imager 22 through the higher angles of reflection fill areas of the imager aperture stop 46 beyond the area that would otherwise be filled by the image of the illuminator aperture stop 44.

Figure 2:
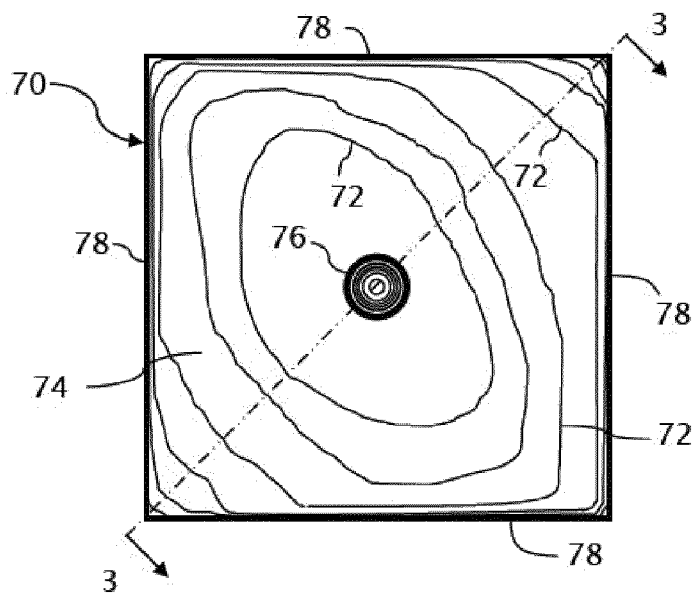
FIG. 2 is greatly enlarged a plan view of a micromirror of a digital micromirror device used as a pattern generator in accordance with the invention and overlaid with topographical contours to show typical surface irregularities.
Figure 3:
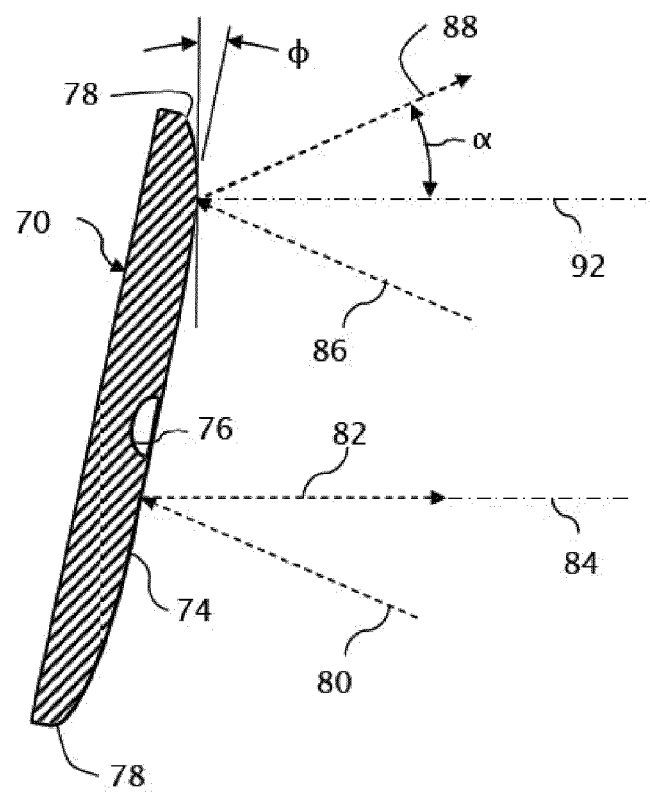
FIG. 3 is a cross-sectional view of the micromirror of FIG. 2 taken along line 3-3 illustrating a cylindrical departure from flatness.

Greatly enlarged views of a micromirror 70, representative of the micromirrors of a digital micromirror device, are shown in FIGS. 2 and 3. Superimposed onto the micromirror 70 of FIG. 2 are topographic contour lines 72 showing flatness variations across a reflective surface 74 of the micromirror 70. The contour lines 72 delineate (a) an overall shape of the reflective surface 74 of micromirror 70 as having a generally cylindrical curvature with an axis perpendicular to the direction of greatest curvature along the section line 3-3, (b) a shape of a divot 76 at the center of the micromirror 70, which is formed as a result of an linkage attachment (not shown) to the back of the micromirror 70, and (c) additional surface variations approaching edges 78 of the micromirror 70.

The cross-sectional view of FIG. 3 the shows the micromirror 70 inclined by an amount that allows an axial ray 80 from the illuminator 22 to reflect from a flat portion reflective surface 74 as a reflected ray 82 that is oriented along a reference axis 84 extending parallel to the optical axis 42 of the imager 22. However, other axial rays from the imager 22, such as the chief ray 86 encounter non-flat portions of the reflective surface 74 and reflect, for example, as the reflected ray 88 that is inclined through angle "α" to a reference axis 92, which parallels the optical axis 42. The angle "α" through which the reflected ray 88 is further inclined, albeit exaggerated for purposes of illustration, corresponds to twice a slope angle "φ" through which the local portion of the reflective surface 74 is inclined from flat. Thus, the local departures from flatness across the reflective surface 74 of the micromirror 70 tend to reflect light through larger angles "α" with respect to the imager optical axis 42.

FIGS. 4A-11A and 4B-11B depict intensity profiles of light within the aperture stop 46 of the imager 22 under varying conditions. For example, FIG. 4A presents a pupil perspective of the aperture stop 46 containing an graphically represented illumination profile of an ideal micromirror considered perfectly flat and without any diffractive effects. The illumination profile 100, which can also be seen in FIG. 4B as sectional plots, is represented by contour lines 102 on a logarithmic scale of intensity. Most of the light energy is within the innermost contour line 104, which encloses the largest area of the illustrated profile 100. The illumination profile 100 is centered within the aperture stop 46 symmetric about the optical axis 42. As seen in FIG. 4B, the vertical and diagonal cross-sectional intensity profiles exactly match. The outermost contour line 106 corresponds approximately to an image of the aperture stop 44 within the illuminator 12 for achieving the desired partial coherence.

Isolated diffraction effects from the edges 78 of an ideal micromirror are depicted in FIGS. 5A and 5B. For negating reflections from the remaining reflective surface 74 of the micromirror, the depicted diffraction pattern is formed by collimated light from the illuminator 12. While most of the light energy remains centered within an innermost contour 108 near the optical axis 42, higher order diffractive effects among the remaining light energy produce spatial frequency distributions 110 in the vertical and horizontal directions corresponding to the orthogonal orientations of the mirror edges 78. A difference between the vertical and diagonal profiles is most apparent at the higher spatial frequencies approaching the periphery of the aperture stop 46.

The combined effects of the reflective surface 74 and edges 78 of an ideal micromirror are presented in FIGS. 6A and 6B. Again, while most of the light energy remains centered about the optical axis 42 within an innermost contour 112, the diffractive effects of the edges 78 produce orthogonal spatial frequency distributions 114 of lesser amounts of light. As shown in FIG. 6B, the vertical and diagonal cross-sectional intensity profiles largely correspond except at the higher spatial frequencies, which contain little of the light energy.

Although the higher spatial frequencies approaching the periphery of the aperture stop 46 contain little of the light energy, the higher spatial frequencies within the orthogonal distributions 114 of diffracted light are particularly important for imaging the edges 78 onto the microlens array 24 with sufficient fidelity to avoid crosstalk between adjacent micromirrors. That is, even though field stops 28 surround the entrance apertures of the microlenses 26 to block light scattered from edges 78, light energy forming individual images of the micromirrors 70 must not extend beyond the field stops 28 and enter adjoining apertures.

Effects associated with variations in flatness, such as depicted for the micromirror 70 in FIG. 2, are presented in FIGS. 7A and 7B. An innermost contour 116 is elongated along the diagonal profile 1 corresponding to the largely cylindrical departure of the reflective surface 74 from flatness. Diffractive effects from the edges 78 also appear to spread through a larger area of the aperture stop 46. The two diagonal intensity profiles 1 and 2 of FIG. 7B depict the extent of this asymmetry. Without further correction, the result is an elongation or other misshaping of the focused spots 34.

Figures 8A, 8B:
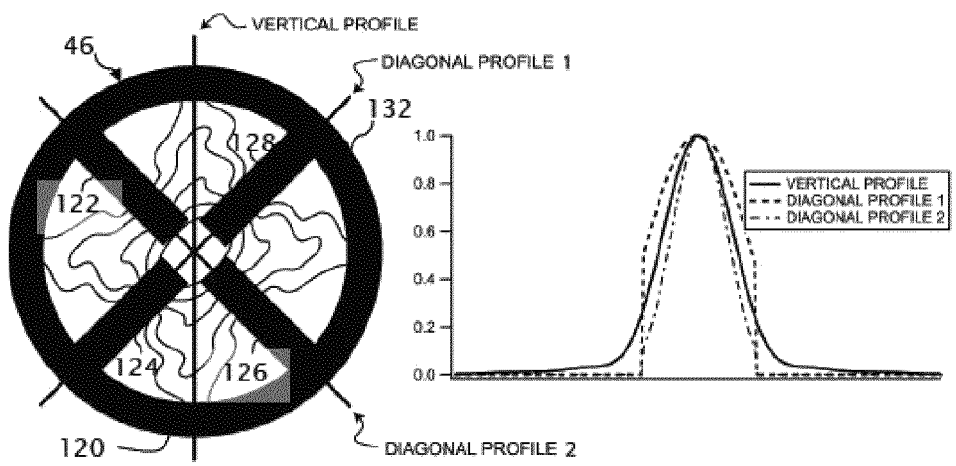
FIG. 8A is a plan view of the imager aperture stop of FIG. 7A with a four-fingered apodizer for balancing energy distributions within the aperture stop.
FIG. 8B is a graph comparing a vertical and two diagonal intensity profile plots across the aperture stop of FIG. 8A.

With reference to FIGS. 8A and 8B, a spatial frequency filter in the form of an apodizer 120 attenuates light within the aperture stop 46 for mitigating the adverse effects of the flatness variations of the micromirror 70 without significantly limiting the finesse with which the micromirror 70 is imaged onto the microlens array 24. The apodizer 120 includes four fingers 122, 124, 126, and 128, which extend radially from a surrounding annulus 132 along the two diagonals from which the diagonal profiles 1 and 2 are drawn. The fingers 122, 124, 126, and 128 stop short of the centermost zone of the aperture stop 46 within which most of the light energy resides. However, the fingers attenuate certain of the midrange spatial frequencies that are responsible for distorting the shape of the focused spots 34. The diagonal orientation of the fingers 122, 124, 126, and 128 preserves the higher spatial frequencies along the vertical and horizontal axes required for imaging the edges 78 with the desired finesse.

Figures 9A, 9B:
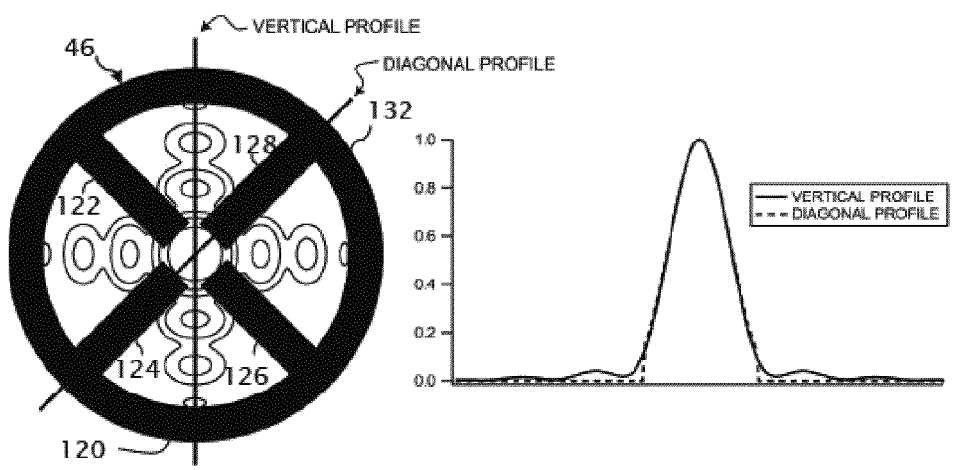
FIG. 9A is a plan view of the imager aperture stop of FIG. 6A with the same four-fingered apodizer of FIG. 8A showing the limited effect of the apodizer on an already balanced energy distribution within the aperture stop.
FIG. 9B is a graph comparing vertical and diagonal intensity profile plots across the aperture stop of FIG. 9A.

FIGS. 9A and 9B depict the same apodizer 120 and its limited effect on the energy distributions from an ideal micromirror as shown in FIGS. 6A and 6B. The vertical and diagonal intensity profiles differ only slightly with the most notable differences limited to the higher spatial frequencies. However, the higher spatial frequencies located along the vertical and horizontal axes most effective for imaging the edges 78 remain undisturbed. In addition, nearly all of the light energy remains for forming the focused spots 34 of a desired shape.

Figures 10A, 10B:
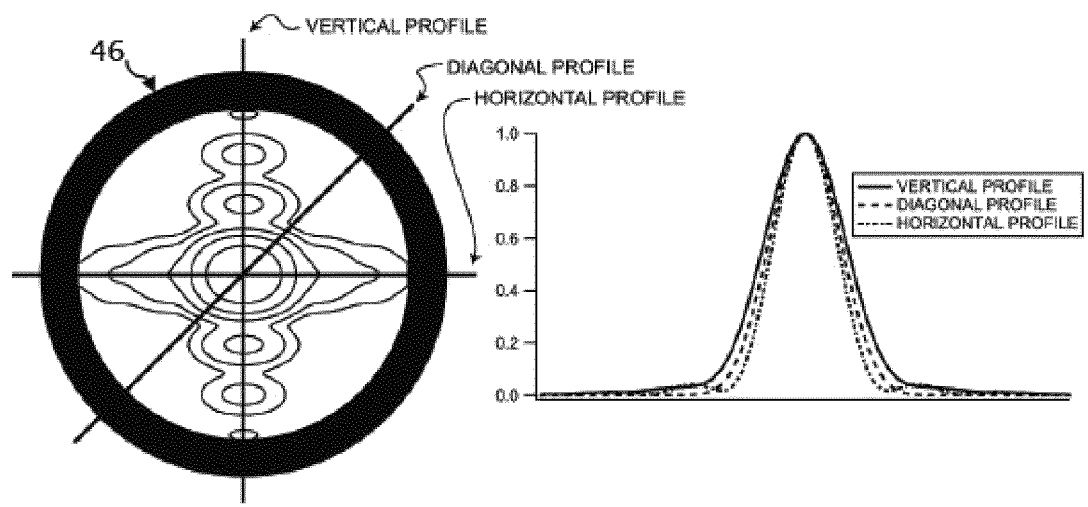
FIG. 10A is a plan view of the imager aperture stop with intensity contours depicting a distribution of light from a different irregularly shaped reflective surface and edges of a micromirror.
FIG. 10B is a graph comparing vertical, horizontal and diagonal intensity profile plots across the aperture stop of FIG. 10A.
Figures 11A, 11B:
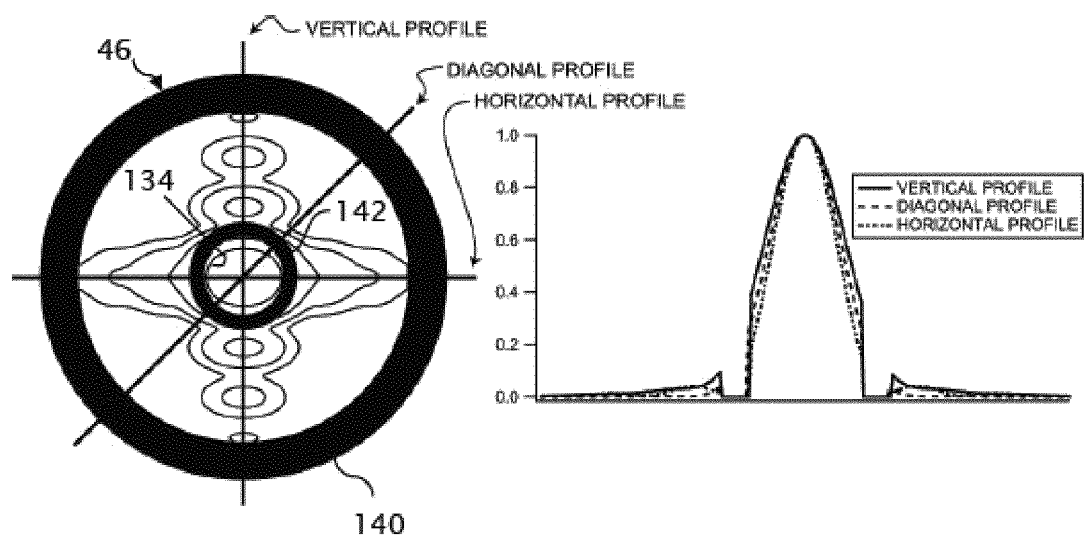
FIG. 11A is a plan view of the imager aperture stop of FIG. 10A with an annular apodizer for balancing energy distributions within the aperture stop.
FIG. 11B is a graph comparing vertical, horizontal and diagonal intensity profile plots across the aperture stop of FIG. 11A.

A different departure from flatness of a micromirror surface is represented by the intensity patterns depicted in FIGS. 10A and 10B corresponding to a cylindrical curvature about the vertical axis. An innermost contour 134 appears elongated along the horizontal axis and departs from the desired distribution of energy for forming rotationally symmetric focused spots 34. Here, the required midrange spatial frequencies most in need of attenuation to restore a more symmetric distribution of light energy lie along the horizontal axis also occupied by the higher spatial frequencies of diffracted light required to image the edges 78. Accordingly, an alternative apodizer 140 is provided having an intermediate annulus 142 for attenuating certain midrange spatial frequencies symmetrically about the optical axis 42. The effect of the intermediate annulus 142 as shown in vertical, horizontal, and diagonal profiles is to remove the same range of spatial frequencies in all directions, so that the resulting energy distribution within the imager pupil is rendered more symmetric about the optical axis 42.

While the four-fingered form of the apodizer 120 is preferable for removing midrange frequencies associated with diagonal misshapes of the micromirrors to the extent that the micromirrors are collectively misshaped in this way, the circular form of the apodizer 140 would be more effective for dealing with orthogonal misshapes or misshapes that tend to vary among the full array of micromirrors in a more random manner. The circular form of the apodizer 140 also limits adverse consequences associated with diffractive edge effects of the apodizers themselves within the imager aperture stop.

Although the apodizers 120 and 140 are shown as entirely blocking light within the aperture zones covered by the fingers 122, 124, 126, and 128 and the intermediate annulus 142, such fingers, annuli, or other apodizer shapes within the aperture zones can be formed with soft edges or other light permeable features for variably attenuating light within the covered zones. The variable attenuation can mitigate the diffractive effects of the apodizers themselves and can provide more finely resolved intensity distributions for balancing light energies in different directions within the aperture stop 46.

The apodizers can be formed in a variety of known ways including as a stamped shape in an opaque plate or as an opaque deposit on an otherwise transparent plate.

Although described with respect to a limited number of embodiments, those of skill in this art will appreciate the numerous other embodiments that can be made in accordance with the overall teaching of this invention.

The invention claimed is:

1. An active spot array projection system comprising
   a spatial light modulator having individually addressable elements for selectively conveying corresponding transverse segments of a light beam along an optical pathway, the individually addressable elements including peripheral boundaries,
   a focusing array along the optical pathway having individual focusing elements for focusing the transverse segments of the light beam into spots,
   an imaging optic along the optical pathway for imaging the individually addressable elements of the spatial light modulator onto the individual focusing elements through a common aperture,
   a spatial frequency filter along the optical pathway between the spatial light modulator and the focusing array arranged to attenuate certain spatial frequencies of light from within the peripheral boundaries of the individually addressable elements for regulating light distributions of the spots without attenuating certain other spatial frequencies of the light scattered from edges along the peripheral boundaries of the individually addressable elements for preserving imaging resolution of the peripheral boundaries of the individually addressable elements and avoiding crosstalk between adjacent spots.

2. The system of claim 1 in which the certain spatial frequencies of light arise from irregularities of the individually addressable elements within the peripheral boundaries of the individually addressable elements and the certain other spatial frequencies include higher spatial frequencies that arise from the peripheral boundaries of the individually addressable elements, and the spatial frequency filter is arranged for attenuating the certain spatial frequencies of light that arise from the irregularities of the individually addressable elements without attenuating the higher spatial frequencies of light that arise from the peripheral boundaries of the individually addressable elements.

3. The system of claim 1 in which the individually addressable elements take the form of rectangular micromirrors, the certain other spatial frequencies of the light scattered from the edges have an orthogonal spatial frequency distribution within a pupil of the imaging optic, and the spatial frequency filter attenuates light within the pupil of the imaging optic along diagonals to the orthogonal spatial frequency distribution.

4. The system of claim 1 further comprising an illuminator for illuminating the individually addressable elements of the spatial light modulator with the light beam, the illuminator having an exit pupil sized for filling a limited portion of an entrance pupil of the imaging optic such that encounters of the light beam with regular features of the individually addressable elements of the spatial light modular remain substantially within the limited portion of the imaging optic pupil filled by the illuminator pupil and encounters of the light beam with irregularities of the individually addressable elements of the spatial light modular expand beyond the limited portion of the imaging optic pupil filled by the illuminator pupil.

5. The system of claim 4 in which the spatial frequency filter attenuates light within an intermediate radial zone of the imaging optic pupil, the intermediate radial zone (a) extending radially beyond the limited portion of the imaging optic pupil filled by the illuminator pupil for attenuating light arising from the irregularities of the individually addressable elements, and (b) being radially offset from a periphery of the imaging optic pupil so that at least a portion of the light within the transverse segments arising from the peripheral boundaries of the individually addressable elements passes through the imaging optic pupil.

6. The system of claim 5 in which the spatial frequency filter attenuates light within angularly spaced parts of the intermediate radial zone for increasing a radial symmetry among a distribution of angles that converge to form the spots.

7. The system of claim 5 in which the spatial frequency filter is an apodizer located proximate to an aperture stop of the imaging optic.

8. The system of claim 5 in which the spatial frequency filter is a phase plate located proximate to an aperture stop of the imaging optic.

9. The system of claim 1 in which the spatial light modulator is a digital micro-mirror device and the individually addressable elements comprise mirrors that are independently switchable between one position that conveys the corresponding transverse segments of the light beam along the optical pathway and another position that conveys the corresponding transverse segments of the light beam in another direction.

10. The system of claim 9 in which the mirrors include local slopes that depart from flatness and the peripheral boundaries correspond to edges of the mirrors, wherein the spatial frequency filter attenuates the certain spatial frequencies of light arising from the local slopes that depart from flatness while limiting attenuation of the certain other spatial frequencies of light that contribute to imaging of the mirror edges onto the individual focusing elements of the focusing array.

11. An active spot array projection system comprising
    a digital micromirror device having individually addressable mirrors for selectively reflecting transverse segments of a light beam along an optical pathway, the individually addressable mirrors including peripheral edges and surface irregularities that depart from flatness through local variations in slope, an illuminator for illuminating the individually addressable mirrors of the digital micromirror device with the light beam, a microlens array along the optical pathway having individual microlenses for focusing the transverse segments of the light beam into spots, an imaging lens along the optical pathway for imaging the individually addressable mirrors of the digital micromirror device onto the individual microlenses through a common aperture, the illuminator having an exit pupil sized for filling a limited portion of an entrance pupil of the imaging lens, the peripheral edges and surface irregularities of the mirrors departing from flatness so as to at least partially fill a remaining portion of the imaging lens pupil, and a filter arranged for attenuating some of the light within the remaining portion of the imaging lens pupil for regulating a shape of the spots while retaining other of the light within the remaining portion of the imaging lens pupil for imaging the peripheral edges of the mirrors onto the microlens array.

12. The system of claim 11 in which portions of the individually addressable mirrors that do not depart from flatness reflect angles of light that remain substantially within the limited portion of the imaging lens pupil filled by the illuminator pupil, and other portions of the individually addressable mirrors that depart from flatness, including both the peripheral edges and surface irregularities of the mirrors, reflect different angles of light that expand beyond the limited portion of the imaging lens pupil filled by the illuminator pupil into the remaining portion of the imaging lens pupil.

13. The system of claim 12 in which the filter is a spatial frequency filter for attenuating certain of the spatial frequencies of light that expand into the remaining portion of the imaging lens pupil.

14. The system of claim 13 in which a low range of the spatial frequencies of light is located within the limited portion of the imaging lens pupil filled by the illuminator pupil and both a midrange and high range of the spatial frequencies of light are located within the remaining portion of the imaging lens pupil, and in which the spatial frequency filter attenuates the midrange of the spatial frequencies for regulating the shape of the spots without attenuating the higher spatial frequencies that contribute to imaging the peripheral edges of the mirrors.

15. The system of claim 14 in which the spatial frequency filter is an apodizer that includes a plurality of fingers that attenuate portions of both the midrange and high range of spatial frequencies.

16. A method of shaping focal spots within an active spot array projection system comprising steps of:

illuminating a spatial light modulator having individually addressable elements with peripheral boundaries for selectively conveying corresponding transverse segments of a light beam along an optical pathway to a focusing array, imaging the individually addressable elements of the spatial light modulator onto the individual focusing elements of the focusing array through a common aperture of an imaging optic, focusing the transverse segments of the light beam reaching the individual focusing elements of the focusing array into spots, and attenuating certain spatial frequencies of light from within the peripheral boundaries of the individually addressable elements in advance of the focusing array for regulating light distributions of the spots without attenuating certain other spatial frequencies of light scattered from edges along the peripheral boundaries of the individually addressable elements for preserving imaging resolution of the peripheral boundaries of the individually addressable elements and avoiding crosstalk between adjacent spots.

17. The method of claim 16 in which the step of attenuating includes attenuating the certain spatial frequencies arising from irregularities of the individually addressable elements within the peripheral boundaries of the individually addressable elements without attenuating the certain other spatial frequencies of light arising from the peripheral boundaries of the individually addressable elements.

18. The method of claim 16 in which the step of illuminating includes illuminating the individually addressable elements of the spatial light modulator through a first numerical aperture of an illuminating optic, the step of imaging includes imaging the individually addressable elements of the spatial light modulator through a second numerical aperture of the imaging optic that is larger than the first numerical aperture, the step of filtering includes attenuating the certain spatial frequencies of light without attenuating the certain other spatial frequencies within the common aperture of the imaging optic.

19. The method of claim 18 in which the step of attenuating includes attenuating light between the first and second numerical apertures.

20. The method of claim 16 including a step of arranging an illuminator for filling a limited portion of a pupil of an imaging optic for imaging the individually addressable elements of the spatial light modulator onto the individual focusing elements of the focusing array.

21. The method of claim 20 in which the step of attenuating includes attenuating light within the pupil of the imaging optic outside the limited portion filled by the illuminator and offset from a periphery of the entrance pupil.

* * * * *